(12) United States Patent
Liu et al.

(10) Patent No.: US 10,168,850 B2
(45) Date of Patent: Jan. 1, 2019

(54) DISPLAY PANEL AND DISPLAY DEVICE

(71) Applicant: Xiamen Tianma Micro-Electronics Co., Ltd., Xiamen (CN)

(72) Inventors: Bozhi Liu, Xiamen (CN); Xu Yang, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 15/891,992

(22) Filed: Feb. 8, 2018

(65) Prior Publication Data

US 2018/0173347 A1 Jun. 21, 2018

(30) Foreign Application Priority Data

Sep. 30, 2017 (CN) .......................... 2017 1 0938325

(51) Int. Cl.
*G06F 3/045* (2006.01)
*H01L 27/32* (2006.01)
*G02F 1/1333* (2006.01)
*H01L 51/52* (2006.01)
*G02F 1/1368* (2006.01)
*G02F 1/1335* (2006.01)
*G02F 1/1345* (2006.01)
*G06F 3/041* (2006.01)
*G06F 3/044* (2006.01)

(52) U.S. Cl.
CPC ............ *G06F 3/045* (2013.01); *G02F 1/1368* (2013.01); *G02F 1/13452* (2013.01); *G02F 1/133514* (2013.01); *G06F 3/041* (2013.01); *H01L 27/323* (2013.01); *H01L 27/3276* (2013.01); *H01L 51/5253* (2013.01); *G02F 1/13338* (2013.01); *G06F 3/044* (2013.01); *G06F 3/0412* (2013.01); *G06F 2203/04105* (2013.01)

(58) Field of Classification Search
CPC .......... G06F 3/045; G06F 3/041; G06F 3/044; G06F 3/0412; G06F 2203/04105; G02F 1/13452; G02F 1/133514; G02F 1/1368; G02F 1/13338; H01L 51/5253; H01L 27/323; H01L 27/3276
See application file for complete search history.

(56) References Cited

U.S. PATENT DOCUMENTS 9,318,427 B2 * 4/2016 Youn .................... H01L 23/4985
2013/0076687 A1 * 3/2013 Giddings .............. G06F 3/0412
345/174

(Continued)

*Primary Examiner* — Andrew Sasinowski
(74) *Attorney, Agent, or Firm* — Alston & Bird LLP

(57) ABSTRACT

A display panel and a display device are disclosed. The display panel includes at least one notch which includes a protrusion structure. A non-display region includes at least one first non-display region arranged along edges of the protrusion structure. At least one first pressure sensor is provided in the first non-display region. An included angle between a first strain detection direction of the first pressure sensor and a first edge of the display panel is greater than or equal to 65 degrees and less than or equal to 115 degrees. An included angle between a second strain detection direction and the first edge of the display panel is greater than or equal to −25 degrees and less than or equal to 0 degree. A control chip is provided in the non-display region, and the first edge is an edge of the display panel close to the control chip.

24 Claims, 28 Drawing Sheets

(56) References Cited

U.S. PATENT DOCUMENTS

| | | | |
|---|---|---|---|
| 2015/0091016 A1* | 4/2015 | Chen | G09G 3/3225 257/72 |
| 2015/0106051 A1* | 4/2015 | Hatanaka | G06F 3/0414 702/150 |
| 2015/0220119 A1* | 8/2015 | Seo | G06F 3/041 345/173 |
| 2016/0130476 A1* | 5/2016 | Lee | C09J 123/22 257/40 |

* cited by examiner

DISPLAY PANEL AND DISPLAY DEVICE

CROSS-REFERENCES TO RELATED APPLICATIONS

This application claims priority to Chinese patent application No. CN201710938325.8, filed on Sep. 30, 2017, the disclosure of which is incorporated herein by reference in its entirety.

TECHNICAL FIELD

Embodiments of the present disclosure relate to display technologies, and in particular, to a display panel and a display device.

BACKGROUND

The touch screen allows users not to use keyboard and mouse operations, and hence human-computer interaction becomes simpler. In order to better meet the need of user, the touch screen is typically provided with a pressure sensor for detecting a magnitude of a touch pressure when the user touches the touch screen.

SUMMARY

Embodiments of the present disclosure provide a display panel and a display device so as to improve a pressure signal detection intensity of a pressure sensor within a protrusion structure formed on at least one side of a notch.

In an aspect, embodiments of the present disclosure provide a display panel. The display panel includes: a first edge and a third edge arranged to be opposite to each other, a second edge and a fourth edge arranged to be opposite to each other, at least one notch arranged on one or more of the first edge, the second edge, the third edge and the fourth edge, and a display region and a non-display region surrounding the display region.

The first edge and the third edge both extend in a first direction, and the second edge and the fourth edge both extend in a second direction perpendicular to the first direction. Adjacent to two of the first edge, the second edge, the third edge and the fourth edge of the display panel are connected by a right angle or a rounded angle.

At least one side of the notch includes a protrusion structure. The non-display region includes at least one first non-display region arranged along edges of the protrusion structure. At least one first pressure sensor is provided in the at least one first non-display region.

The at least one first pressure sensor includes a first strain detection direction and a second strain detection direction. An included angle between the first strain detection direction and the first edge of the display panel is greater than or equal to 65 degrees and less than or equal to 115 degrees. An included angle between the second strain detection direction and the first edge of the display panel is greater than or equal to −25 degrees and less than or equal to 0 degree. A control chip is provided in the non-display region, and the first edge is an edge of the display panel close to the control chip.

In another aspect, embodiments of the present disclosure further provide a display device. The display device includes the display panel in the first aspect.

The display panel provided by embodiments of the present disclosure includes at least one notch arranged at one or more edges of the display panel. The display panel further includes a display region and a non-display region surrounding the display region. At least one side of the notch includes a protrusion structure. The non-display region includes at least one first non-display region arranged along edges of the protrusion structure. At least one first pressure sensor is provided in the first non-display region. The first pressure sensor includes a first strain detection direction and a second strain detection direction. An included angle between the first strain detection direction and a first edge of the display panel is greater than or equal to 65 degrees and less than or equal to 115 degrees. An included angle between the second strain detection direction and the first edge of the display panel is greater than or equal to −25 degrees and less than or equal to 0 degree. A control chip is provided in the non-display region, and the first edge is an edge of the display panel close to the control chip. In such the arrangement, when the touch operation is performed at the center of the protrusion structure, the included angle between the major axis direction of the stain in the first non-display region and the first edge can be close to the first strain detection direction or the second strain detection direction of the first pressure sensor, thereby improving a pressure signal detection intensity of the first pressure sensor and enabling the first pressure sensor to effectively detect the pressure touch operation of the user.

BRIEF DESCRIPTION OF DRAWINGS

Other features, objectives, and advantages of the present disclosure will become more apparent by reading the detailed description of non-limiting embodiments with reference to the following accompanying drawings.

DETAILED DESCRIPTION

Figure 1:
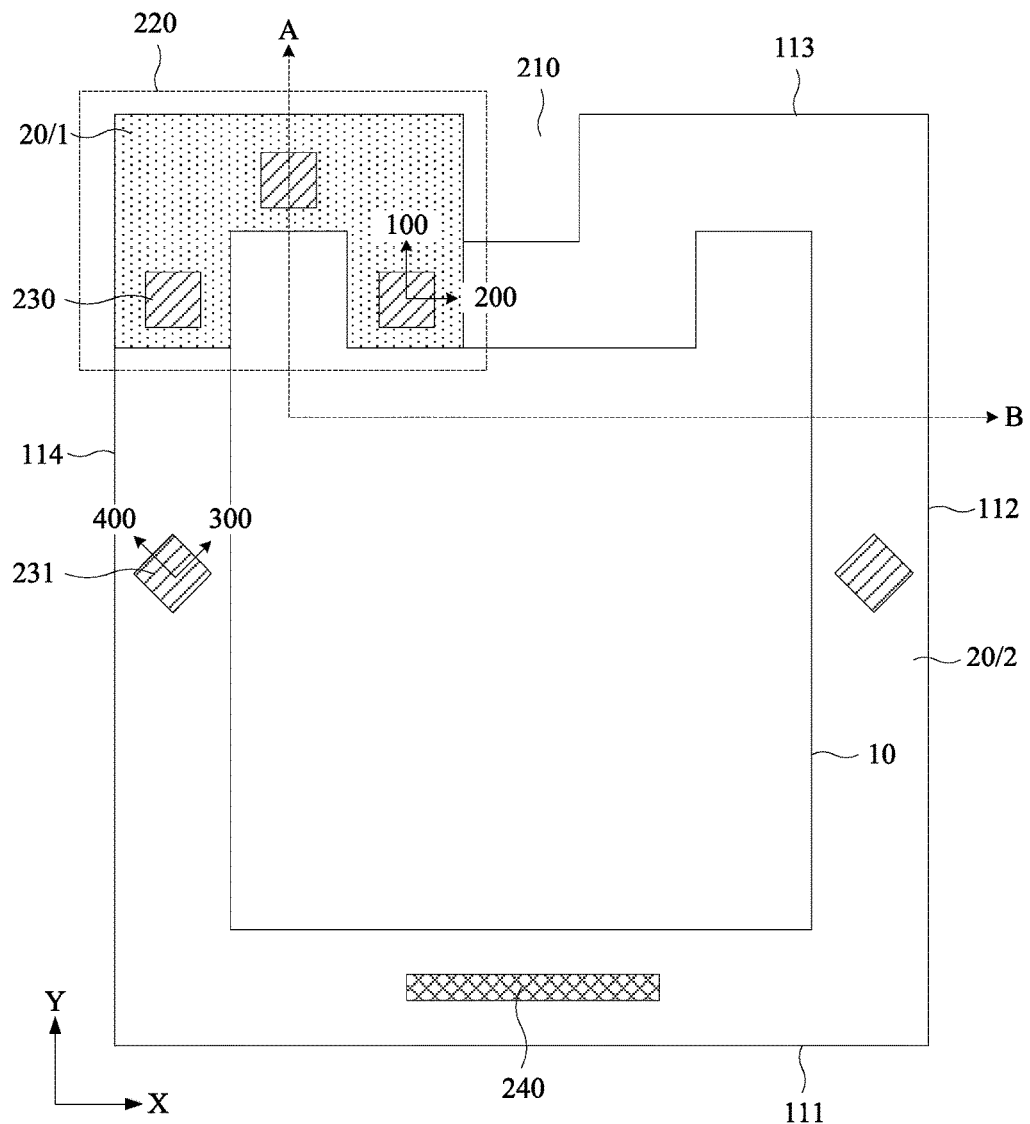
FIG. 1 is a structural schematic diagram of a display panel provided by an embodiment of the present disclosure.

In order to further illustrate the technical means and effects of the present disclosure to achieve the intended purposes, specific implementations, structures, features and effects of a display panel and a display device provided according to the present disclosure are described in detail below with reference to embodiments and accompanying drawings.

For a conventional rectangular touch screen, when a user performs a pressure touch operation at the center of the touch screen, an included angle between a major axis direction of strain for most part of frame region of the touch screen and a short edge of the touch screen are substantially 45 degrees or −45 degrees, and the included angle between the major axis direction of strain for only a very small part of the frame region and the short edge of the touch screen is substantially 0 degree. Therefore, in order to make the pressure touch sensor within the frame region of the touch screen more sensitive, an included angle between a first strain detection direction of the pressure sensor and the short edge of the touch screen is typically configured to be 45 degrees and an included angle between a second strain detection direction of the pressure sensor and the short edge of the touch screen is typically configured to be −45 degrees.

For a special-shaped display screen having an edge with a notch, at least a side of the notch has a protrusion region. The frame region in the protrusion region is a first frame region. When the pressure touch is operated in the protrusion region, the pressing center is substantially the center of the protrusion region, since the operation space of the protrusion region is small in terms of the pressure operation. A distance between the pressing center and the first frame region in the special-shaped display screen when a user performs the pressure touch operation at the center of the protrusion region is smaller than a distance between the frame region and the pressing center in the conventional rectangular touch screen when the user performs the pressure touch operation at the center of the conventional rectangular touch screen, so that the included angle between the major axis direction of strain in the first frame region and the short edge of the touch screen is no longer about 45 degrees or −45 degrees. If still employing the configuration that the included angle between the first strain detection direction and the short edge of the touch screen is 45 degrees and the included angle between the second strain detection direction and the short edge of the touch screen is −45 degrees, the performance of the pressure sensor in the first frame region is poor, thereby ineffectively detecting the pressure touch operation.

An embodiment of the present disclosure provides a display panel. The display panel includes a first edge and a third edge arranged to be opposite to each other, and a second edge and a fourth edge arranged to be opposite to each other. Both the first edge and the third edge extend in a first direction, both the second edge and the fourth edge extend in a second direction perpendicular to the first direction, and adjacent two of the first edge, the second edge, the third edge and the fourth edge of the display panel are connected by a right angle or a rounded angle.

The display panel further includes at least one notch arranged on one or more edges of the display panel.

The display panel includes a display region and a non-display region surrounding the display region.

At least one side of the notch includes a protrusion structure. The non-display region includes at least one first non-display region arranged along edges of the protrusion structure, and at least one first pressure sensor is provided in the at least one first non-display region.

The first pressure sensor includes a first strain detection direction and a second strain detection direction. An included angle between the first strain detection direction and the first edge of the display panel is greater than or equal to 65 degrees and less than or equal to 115 degrees. An included angle between the second strain detection direction and the first edge of the display panel is greater than or equal to −25 degrees and less than or equal to 0 degree. A control chip is provided in the non-display region, and the first edge is an edge of the display panel close to the control chip.

The display panel provided by embodiments of the present disclosure includes at least one notch arranged at one or more edges of the display panel. The display panel further includes a display region and a non-display region surrounding the display region. At least one side of the notch includes a protrusion structure. The non-display region includes at least one first non-display region arranged along edges of the protrusion structure. At least one first pressure sensor is provided in the first non-display region. The first pressure sensor includes a first strain detection direction and a second strain detection direction. An included angle between the first strain detection direction and a first edge of the display panel is greater than or equal to 65 degrees and less than or equal to 115 degrees. An included angle between the second strain detection direction and the first edge of the display panel is greater than or equal to −25 degrees and less than or equal to 0 degree. A control chip is provided in the non-display region, and the first edge is an edge of the display panel close to the control chip. In such the arrangement, when the touch operation is performed at the center of the protrusion structure, the included angle between the major axis direction of stain in the first non-display region and the first edge can be close to the first strain detection direction or the second strain detection direction, thereby improving a pressure signal detection intensity of the first pressure sensor and enabling the first pressure sensor to effectively detect the pressure touch operation of the user.

The core idea of the present application is mentioned above. The technical solutions in the embodiments of the present disclosure will be described clearly and completely below with the embodiments of the present disclosure with reference to the accompanying drawings. Apparently, the described embodiments are merely some of the embodiments of the present disclosure rather than all of the embodiments. All other embodiments obtained by those of ordinary skill in the art based on the embodiments of the present disclosure without any creative effort shall fall within the protection scope of the present disclosure.

Many specific details will be illustrated in the description below for fully understanding the disclosure; however, the disclosure may also be implemented in other embodiments different from those described herein. It may be similarly extended by one skilled in the art without departing from the spirit of the disclosure. Therefore, the disclosure will not be limited to the embodiments disclosed below.

Next, the disclosure will be described in detail in conjunction with the drawings. In the description of the embodiments of the disclosure, for easy illustration, schematic diagrams showing the structure of a device are not partially enlarged to scale. Moreover, the schematic diagrams are exemplary only, without limiting the protection scope of the disclosure. Additionally, three-dimensional space sizes of length, width and height should be included in practical manufacture.

FIG. 1 is a structural schematic diagram of a display panel provided by an embodiment of the present disclosure. As shown in FIG. 1, the display panel includes a first edge 111 and a third edge 113 arranged to be opposite to each other, and a second edge 112 and a fourth edge 114 arranged to be opposite to each other. The first edge 111 and the third edge 113 both extend in a first direction X, the second edge 112 and the fourth edge 114 both extend in a second direction Y perpendicular to the first direction X, and adjacent edges are connected by a predefined angle, such as a right angle or a rounded angle. The display panel further includes at least one notch 210 arranged on an edge of the display panel. The display panel includes a display region 10 and a non-display region 20 surrounding the display region 10. At least one side of the notch 210 includes a protrusion structure 220. The non-display region 20 includes at least one first non-display region 20/1 arranged along edges of the protrusion structure 220, and at least one first pressure sensor 230 is provided in the first non-display region 20/1. The first pressure sensor 230 includes a first strain detection direction 100 and a second strain detection direction 200. An included angle between the first strain detection direction 100 and the first edge 111 of the display panel is greater than or equal to 65 degrees and less than or equal to 115 degrees. An included angle between the second strain detection direction 200 and the first edge 111 of the display panel is greater than or equal to −25 degrees and less than or equal to 0 degree. A control chip 240 is provided in the non-display region 20, and the first edge 111 is an edge of the display panel close to the control chip 240.

Figure 2:
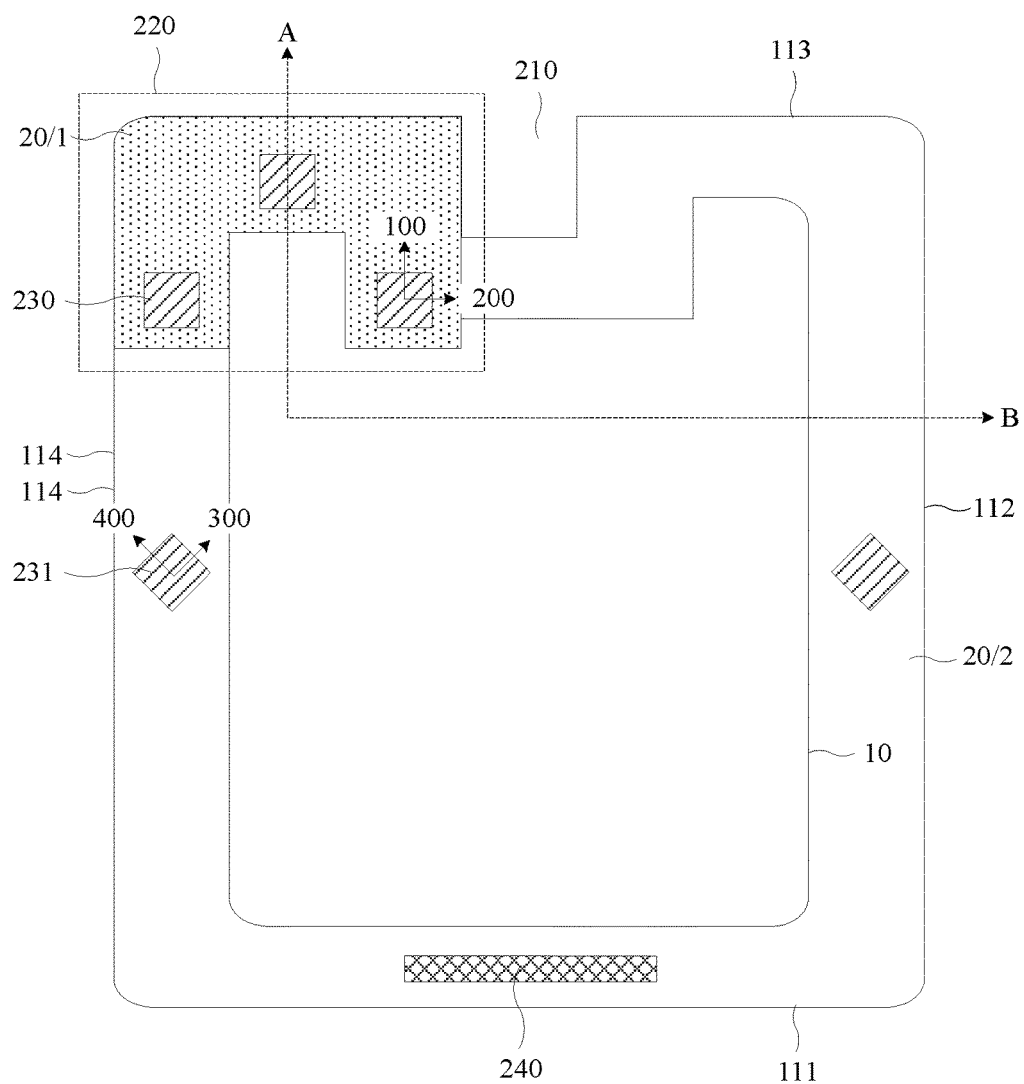
FIG. 2 is a structural schematic diagram of another display panel provided by an embodiment of the present disclosure.

FIG. 2 is a structural schematic diagram of another display panel provided by an embodiment of the present disclosure. The structure of the display panel shown in FIG. 2 is similar as that shown in FIG. 1. The difference is that adjacent edges of the display panel shown in FIG. 2 are connected by a rounded angle. It should be noted that the connection manner of adjacent edges of the display panel is reasonably configured according to actual requirements.

It should be noted that FIGS. 1 and 2 merely exemplarily illustrate that the notch 210 is arranged at the third edge 113 of the display panel, rather than limit the number of the notches 210 and the positions of the notches 210. In other implementations of this embodiment, the notch 210 may also be arranged at another edge of the display panel, and the number of the notches 210 may be two or more and may be arranged at a same edge of the display panel or at different edges of the display panel, which are not specifically limited in this embodiment.

Figure 3:
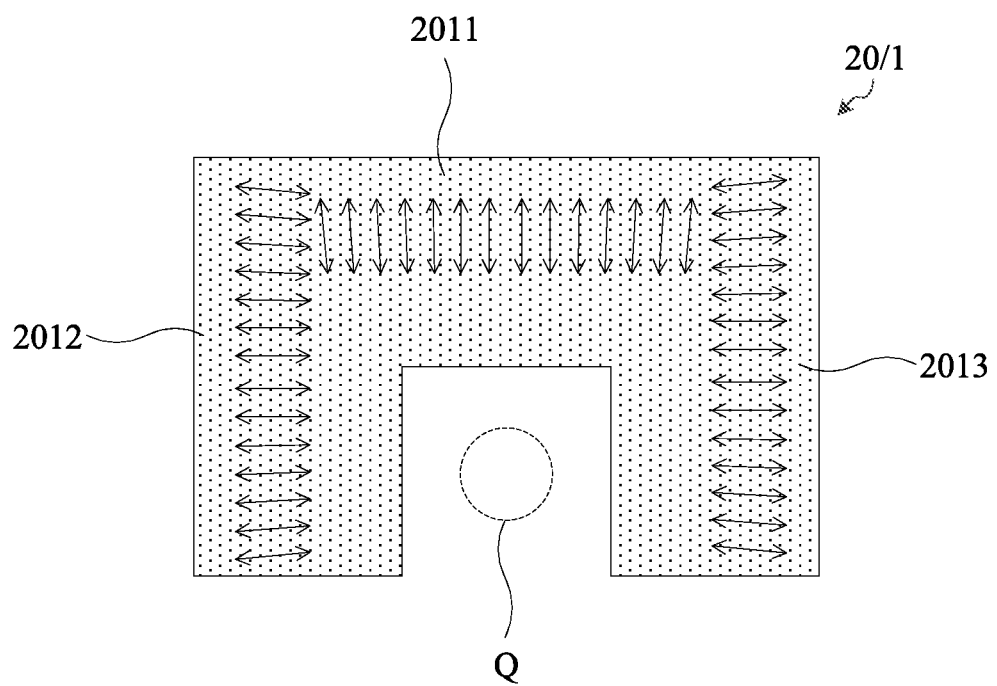
FIG. 3 is a schematic diagram showing a strain vector distribution corresponding to a first non-display region in a dotted box in FIG. 1.

FIG. 3 is a schematic diagram showing a strain vector distribution corresponding to a first non-display region in a dotted box in FIG. 1. It should be noted that FIG. 3 is obtained when a user presses a central region Q of the protrusion structure in a dotted box. As shown in FIG. 3, the first non-display region 20/1 includes a first sub portion 2011, a second sub portion 2012 and a third sub portion 2013. It can be seen from FIGS. 1 and 3, an included angle between a strain direction (indicated by double-headed arrows in FIG. 3) at each position in the first sub portion 2011 and the first edge 111 is about 90 degrees, and an included angle between a strain direction at each position in each of the second sub portion 2012 and the third sub portion 2013 and the first edge 111 is about zero. It should be understood that when the strain detection direction of the pressure sensor is the same as the major axis direction (the strain direction shown in FIG. 3) of the strain at the position of the display panel where the pressure sensor is located, the intensity of the pressure detection signal of the pressure sensor is stronger. Therefore, the included angle between the first edge 111 and the first strain detection direction 100 of the first pressure sensor in the first non-display region 20/1 is configured to be about zero, and the included angle between the second strain detection direction 200 and the first edge 111 is configured to be about zero. Further, it can be seen from the simulation data result in FIG. 3 that the included angle between the first edge 111 and the strain direction at each position in the first sub portion 2011 is substantially within a range of 90±25 degrees, and the included angle between the first edge 111 and the strain direction at each position in the second sub portion 2012 and the third sub portion 2013 is substantially within a range of 0±25 degrees. As a result, to improve the intensity of the pressure detection signal of the first pressure sensor 230, optionally in the present embodiment, the value of the included angle between the first edge 111 and the first strain detection direction 100 of the first pressure sensor 230 is set to be selected from a range of 90±25 degrees and the value of the included angle between the first edge 111 and the second strain detection direction 200 is set to be selected from a range of 0±25 degrees. That is, the value range of the included angle between the first strain detection direction 100 and the first edge 111 is greater than or equal to 65 degrees and less than or equal to 115 degrees, and the value range of the included angle between the second strain detection direction 200 and the first edge 111 is greater than or equal to −25 degrees and less than or equal to 25 degrees.

The display panel provided by embodiments of the present disclosure includes at least one notch 210 arranged at one or more edges of the display panel. The display panel further includes a display region 10 and a non-display region 20 surrounding the display region 10. The at least one side of the notch 210 includes a protrusion structure 220. The non-display region 20 includes at least one first non-display region 20/1 arranged along edges of the protrusion structure 220. At least one first pressure sensor 230 is provided in the first non-display region 20/1. The first pressure sensor 230 includes a first strain detection direction 100 and a second strain detection direction 200. An included angle between the first strain detection direction 100 and the first edge 111 of the display panel is greater than or equal to 65 degrees and less than or equal to 115 degrees. An included angle between the second strain detection direction 200 and the first edge 111 of the display panel is greater than or equal to −25 degrees and less than or equal to 0 degree. The control chip 240 is provided in the non-display region 20, and the first edge 111 is defined as an edge of the display panel close to the control chip 240, such that when the touch operation is performed at the center of the protrusion structure 220, the included angle between the major axis direction of strain in the first non-display region 20/1 and the first edge 111 is similar as the included angle between the first edge 111 and the first strain detection direction 100 or the second strain detection direction 200, thereby improving a pressure signal detection intensity of the first pressure sensor 230 and enabling the first pressure sensor 230 to effectively detect the pressure touch operation of the user.

Exemplarily, as shown in FIG. 1, the included angle between the first strain detection direction 100 and the first edge 111 of the display panel may be 90 degrees, and the included angle between the second strain detection direction 200 and the first edge 111 of the display panel may be zero. With reference to the above analyze of the data in FIG. 3, the included angle between the first edge 111 and the strain direction at each position in the first sub portion 2011 is about 90 degrees, and the included angle between the first edge 111 and the strain direction at each position in the second sub portion 2012 and the third sub portion 2013 is about zero. Therefore, optionally, the included angle between the first strain detection direction 100 of the first pressure sensor 230 in the first non-display region 20/1 is configured to be zero, and the included angle between the second strain detection 200 and the first edge 111 of the display panel is configured to be 90 degrees. With such configuration, when the user presses the central region of the protrusion structure 220, the strain direction of the display panel at the position where the first pressure sensor 230 is located is deflected in a very small angle from the first strain detection direction 100 or the second strain detection direction 200, and a component of the strain of the display panel in the first strain detection direction 100 or the second strain detection direction 200 is large. After the first pressure sensor 230 is arranged, under a pressure touch operation of the user, an amount of deformation of the first pressure sensor 230 in the first strain detection direction 100 and the second strain detection direction 200 is large, and hence the intensity of the pressure detection signal is large.

As shown in FIGS. 1 and 2, a shape of the notch 210 is a rectangular. It should be understood that, in other implementations of this embodiment, the shape of the notch 210 may be semicircular, triangular or trapezoidal and the like.

Still referring to FIG. 1, the non-display region 20 may further include a second non-display region 20/2 in addition to the at least one first non-display region 20/1. At least one second pressure sensor 231 is provided in the second non-display region 20/2. The second pressure sensor 231 includes a third strain detection direction 300 and a fourth strain detection direction 400. An included angle between the third strain detection direction 300 and the first edge 111 of the display panel is greater than or equal to 20 degrees and less than or equal to 70 degrees. An included angle between the fourth strain detection direction 400 and the first edge 111 of the display panel is greater than or equal to −70 degrees and less than or equal to −20 degrees.

Optionally, as shown in FIG. 1, the included angle between the third strain detection direction 300 and the first edge 111 of the display panel is 45 degrees, and the included angle between the fourth strain detection direction 400 and the first edge 111 of the display panel is −45 degrees.

It should be noted that when the user performs the touch operation at the center region of the display panel, the distribution condition of the included angles between major axis directions of the strains in the second non-display region 20/2 and the first edge 111 (the short edge of the touch screen) is the same as that in the conventional rectangular touch screen in the prior art, so that the configuration of the third pressure detection direction 300 and the fourth pressure detection direction 400 of the second pressure sensor 231 in the second non-display region 20/2 is the same as that of the pressure sensor in the prior art. For the configuration of the pressure sensor in the prior art, reference may be made to the associated description in the background.

Figure 4:
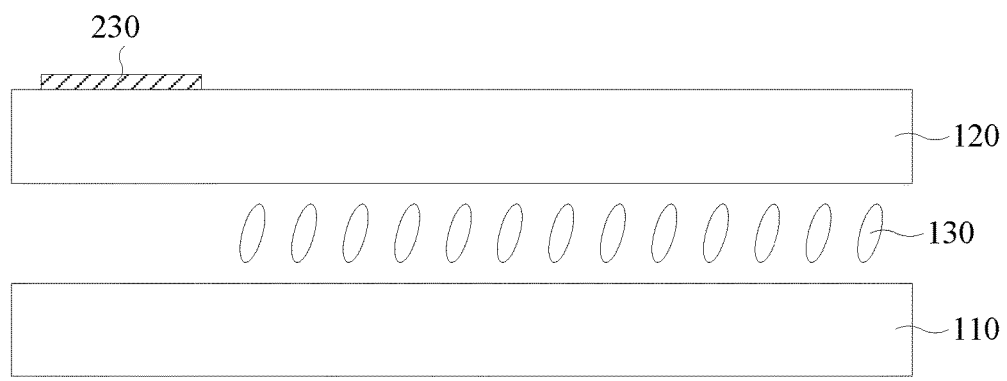
FIG. 4 is a schematic diagram of a cross-sectional structure taken along a dotted line AB in FIG. 1.

FIG. 4 is a schematic diagram of a cross-sectional structure taken along a dotted line AB in FIG. 1. As shown in FIG. 4, the display panel includes an array substrate 110, a color filter substrate 120 arranged to be opposite to the array substrate 110 and a liquid crystal layer 130 between the array substrate 110 and the color filter substrate 120. The first pressure sensor 230 may be disposed on a surface of the color filter substrate 120 away from the array substrate 110.

Figure 5:
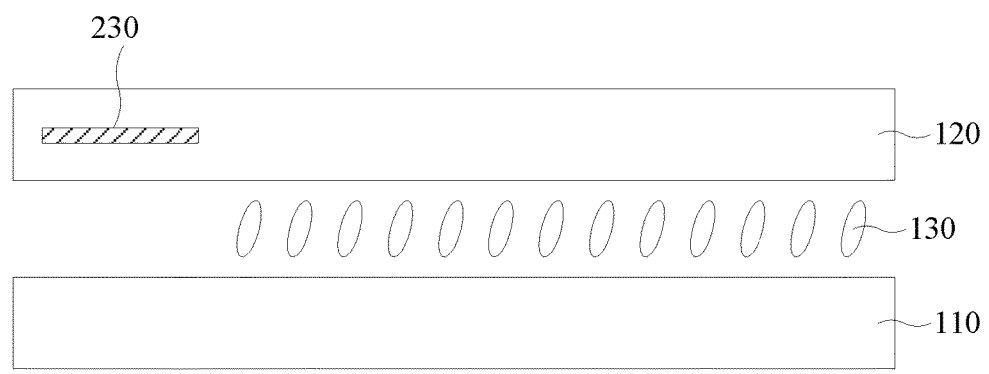
FIG. 5 is a schematic diagram of another cross-sectional structure taken along a dotted line AB in FIG. 1.

FIG. 5 is a schematic diagram of another cross-sectional structure taken along a dotted line AB in FIG. 1. As shown in FIG. 5, the display panel includes an array substrate 110, a color filter substrate 120 arranged to be opposite to the array substrate 110 and a liquid crystal layer 130 between the array substrate 110 and the color filter substrate 120. The first pressure sensor 230 may be disposed inside the color filter substrate 120.

Figure 6:
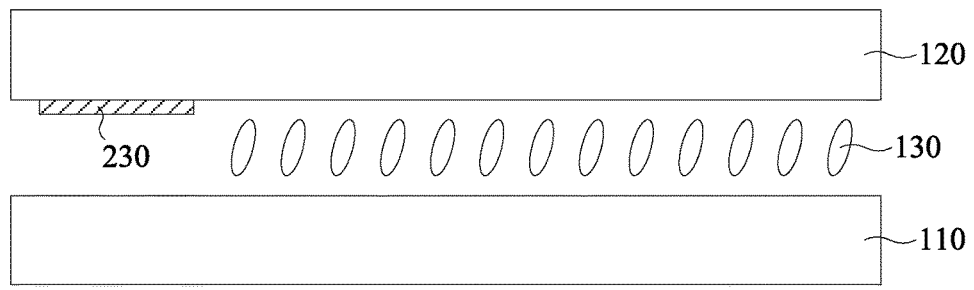
FIG. 6 is a schematic diagram of another cross-sectional structure taken along a dotted line AB in FIG. 1.

FIG. 6 is a schematic diagram of another cross-sectional structure taken along a dotted line AB in FIG. 1. As shown in FIG. 6, the display panel includes an array substrate 110, a color filter substrate 120 arranged to be opposite to the array substrate 110 and a liquid crystal layer 130 between the array substrate 110 and the color filter substrate 120. The first pressure sensor 230 may be disposed on a surface of the color filter substrate 120 facing the array substrate 110.

Figure 7:
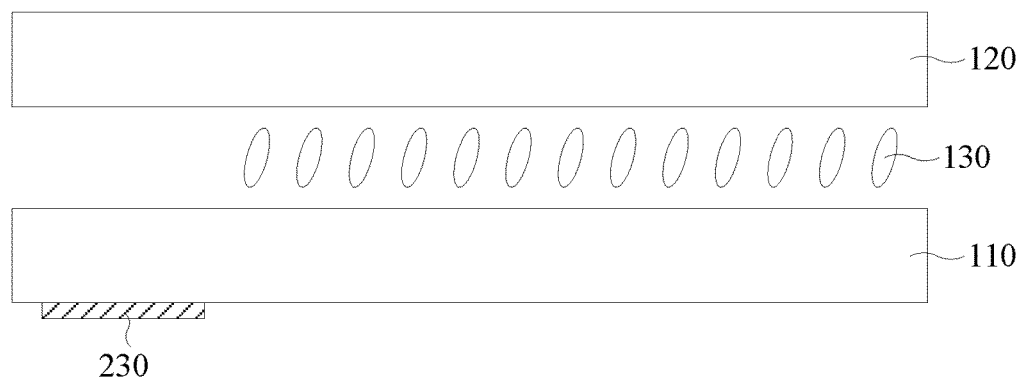
FIG. 7 is a schematic diagram of another cross-sectional structure taken along a dotted line AB in FIG. 1.

FIG. 7 is a schematic diagram of another cross-sectional structure taken along a dotted line AB in FIG. 1. As shown in FIG. 7, the display panel includes an array substrate 110, a color filter substrate 120 arranged to be opposite to the array substrate 110 and a liquid crystal layer 130 between the array substrate 110 and the color filter substrate 120. The first pressure sensor 230 may be disposed on a surface of the array substrate 110 away from the color filter substrate 120.

Figure 8:
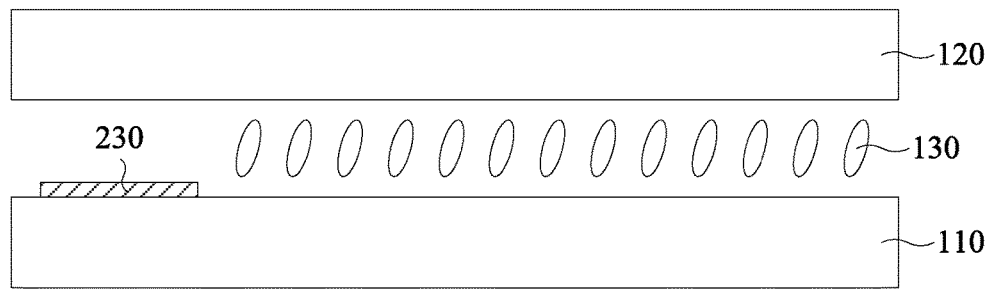
FIG. 8 is a schematic diagram of another cross-sectional structure taken along a dotted line AB in FIG. 1.

FIG. 8 is a schematic diagram of another cross-sectional structure taken along a dotted line AB in FIG. 1. As shown in FIG. 8, the display panel includes an array substrate 110, a color filter substrate 120 arranged to be opposite to each other the array substrate 110 and a liquid crystal layer 130 between the array substrate 110 and the color filter substrate 120. The first pressure sensor 230 may be disposed on a surface of the array substrate 110 facing the color filter substrate 120.

Figure 9:
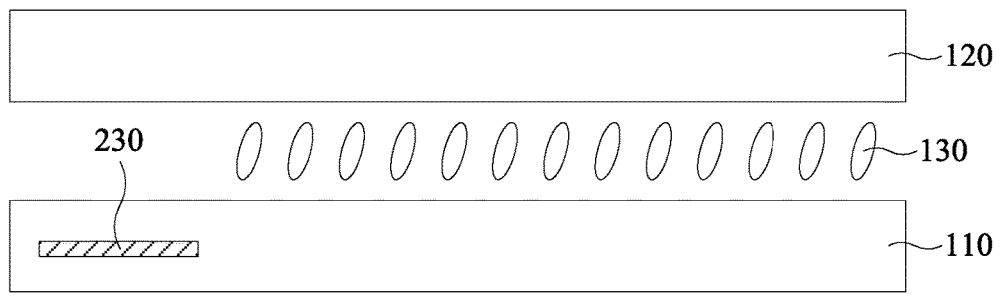
FIG. 9 is a schematic diagram of another cross-sectional structure taken along a dotted line AB in FIG. 1.

FIG. 9 is a schematic diagram of another cross-sectional structure taken along a dotted line AB in FIG. 1. As shown in FIG. 9, the display panel includes an array substrate 110, a color filter substrate 120 arranged to be opposite to each other the array substrate 110 and a liquid crystal layer 130 between the array substrate 110 and the color filter substrate 120. The first pressure sensor 230 may be disposed inside the array substrate 110.

Figure 10:
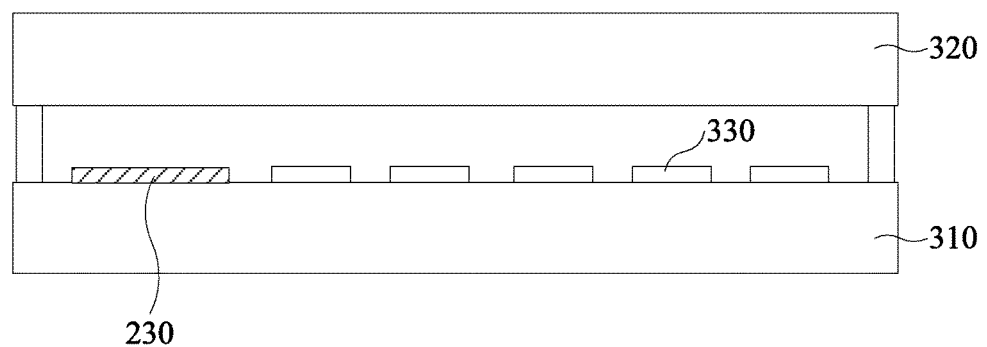
FIG. 10 is a schematic diagram of another cross-sectional structure taken along a dotted line AB in FIG. 1.

FIG. 10 is a schematic diagram of another cross-sectional structure taken along a dotted line AB in FIG. 1. As shown in FIG. 10, the display panel includes an array substrate 310, an organic light-emitting device layer 330 and an encapsulation layer 320. The first pressure sensor 230 may be disposed on a surface of the array substrate 310 facing the encapsulation layer 320.

Figure 11:
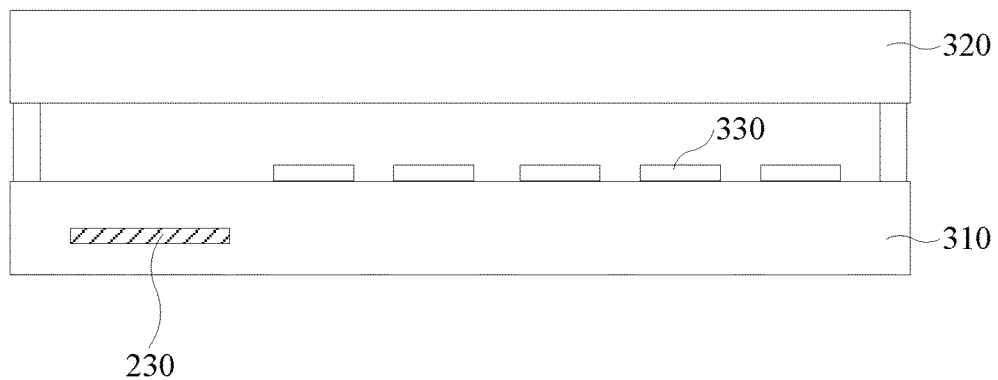
FIG. 11 is a schematic diagram of another cross-sectional structure taken along a dotted line AB in FIG. 1.

FIG. 11 is a schematic diagram of another cross-sectional structure taken along a dotted line AB in FIG. 1. As shown in FIG. 11, the display panel includes an array substrate 310, an organic light-emitting device layer 330 and an encapsulation layer 320. The first pressure sensor 230 may be disposed inside the array substrate 310.

Figure 12:
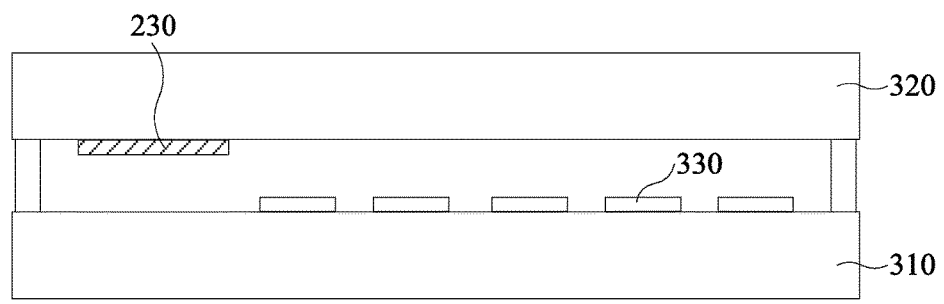
FIG. 12 is a schematic diagram of another cross-sectional structure taken along a dotted line AB in FIG. 1.

FIG. 12 is a schematic diagram of another cross-sectional structure taken along a dotted line AB in FIG. 1. As shown in FIG. 12, the display panel includes an array substrate 310, an organic light-emitting device layer 330 and an encapsulation layer 320. The first pressure sensor 230 may be disposed on a surface of the encapsulation layer 320 facing the array substrate 310.

Figure 13:
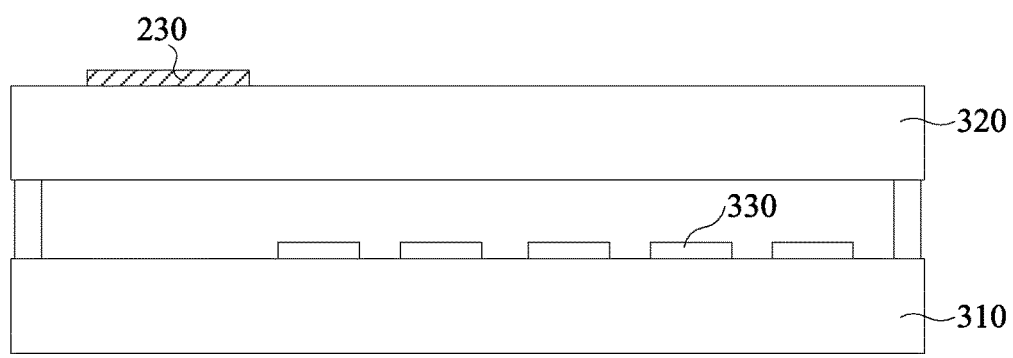
FIG. 13 is a schematic diagram of another cross-sectional structure taken along a dotted line AB in FIG. 1.

FIG. 13 is a schematic diagram of another cross-sectional structure taken along a dotted line AB in FIG. 1. As shown in FIG. 13, the display panel includes an array substrate 310, an organic light-emitting device layer 330 and an encapsulation layer 320. The first pressure sensor 230 may be disposed on a surface of the encapsulation layer 320 away from the array substrate 310.

Figure 14:
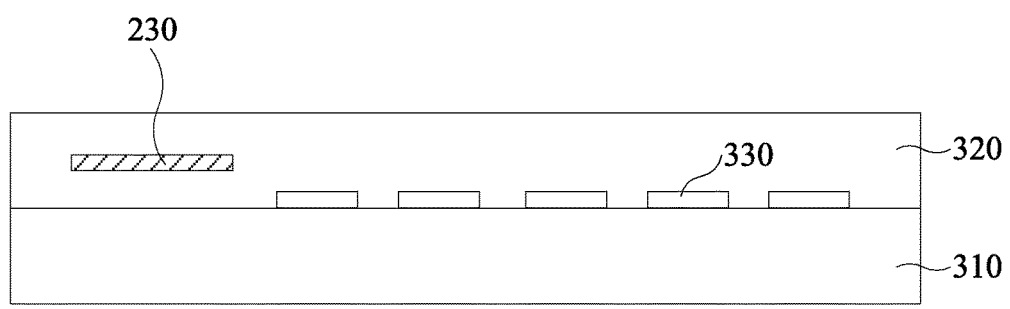
FIG. 14 is a schematic diagram of another cross-sectional structure taken along a dotted line AB in FIG. 1.
Figure 18:
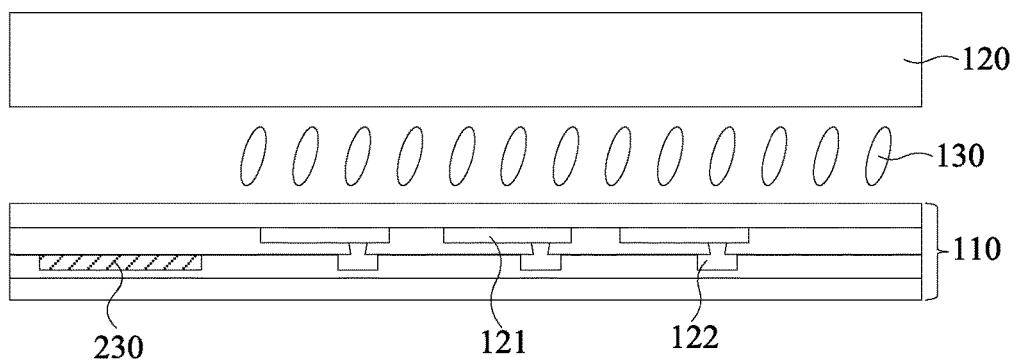
FIG. 18 is a schematic diagram of another cross-sectional structure taken along a dotted line AB in FIG. 1.

FIG. 14 is a schematic diagram of another cross-sectional structure taken along a dotted line AB in FIG. 1. As shown in FIG. 14, the display panel includes an array substrate 310, an organic light-emitting device layer 330 and an encapsulation layer 320. The first pressure sensor 230 may be disposed inside the encapsulation layer 320. It should be noted that the encapsulation layer 320 in FIG. 18 is a thin film encapsulation layer, the thin film encapsulation layer may be a stacked structure of organic layers and inorganic layers, and the first pressure sensor 230 may be disposed between any two adjacent layers.

It should be noted that, for the organic light-emitting display panel, as shown in FIGS. 10 to 13, the encapsulation layer 320 may be a cover plate. Alternatively, as shown in FIG. 14, the encapsulation layer 320 may be a thin film encapsulation layer. It should be noted that when the encapsulation layer 320 is a cover plate, since the cover plate is a single layer structure, the first pressure sensor 230 can only be disposed on the surface of the encapsulation layer 320 facing the array substrate 310 or on the surface of the encapsulation layer 320 away from the array substrate 310, but cannot be disposed inside the encapsulation layer 320.

Figure 15:
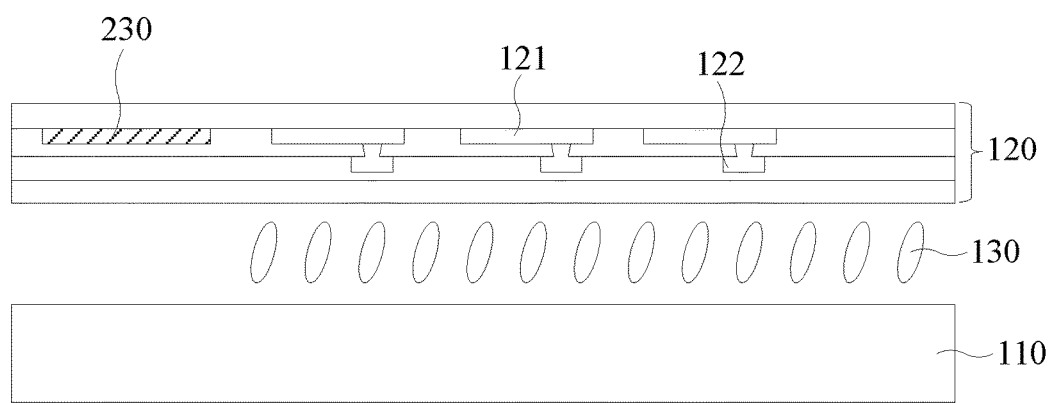
FIG. 15 is a schematic diagram of another cross-sectional structure taken along a dotted line AB in FIG. 1.
Figure 16:
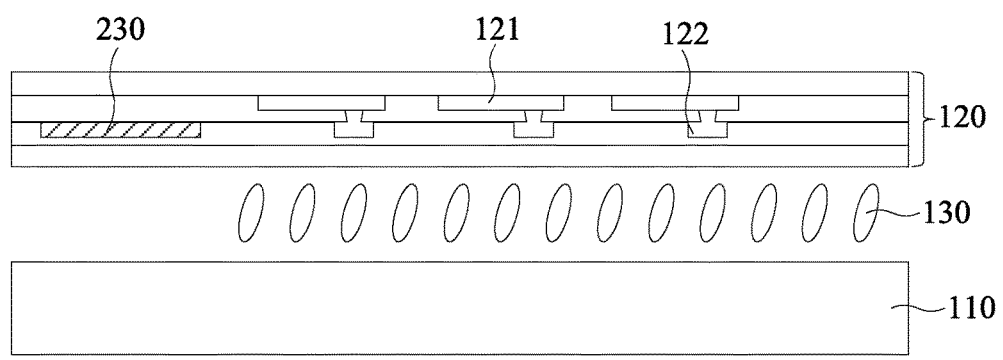
FIG. 16 is a schematic diagram of another cross-sectional structure taken along a dotted line AB in FIG. 1.
Figure 17:
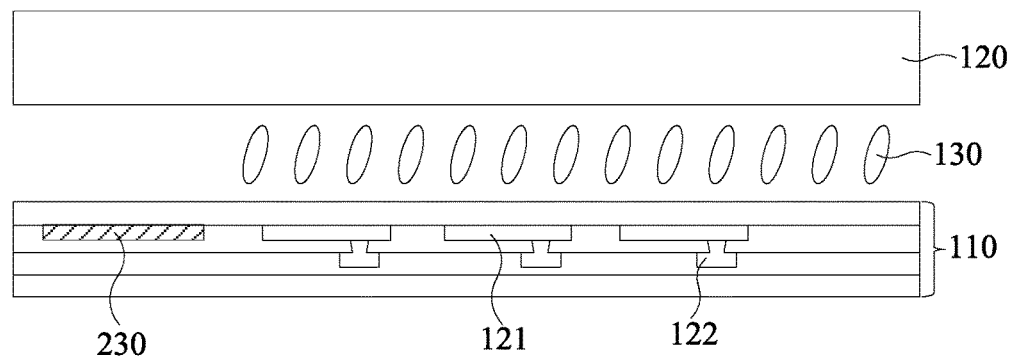
FIG. 17 is a schematic diagram of another cross-sectional structure taken along a dotted line AB in FIG. 1.
Figure 19:
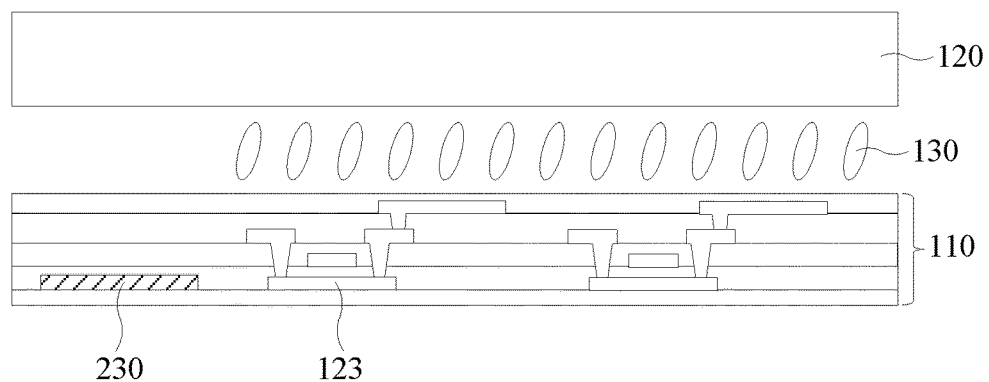
FIG. 19 is a schematic diagram of another cross-sectional structure taken along a dotted line AB in FIG. 1.
Figure 20:
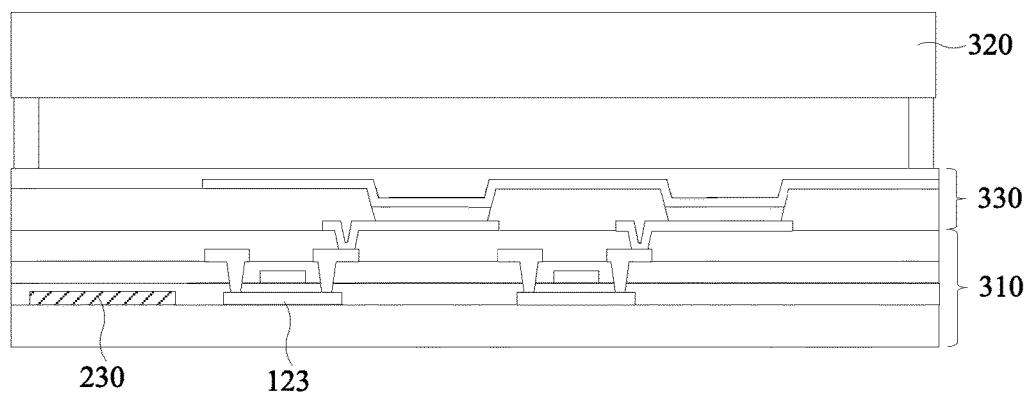
FIG. 20 is a schematic diagram of another cross-sectional structure taken along a dotted line AB in FIG. 1.
Figure 21:
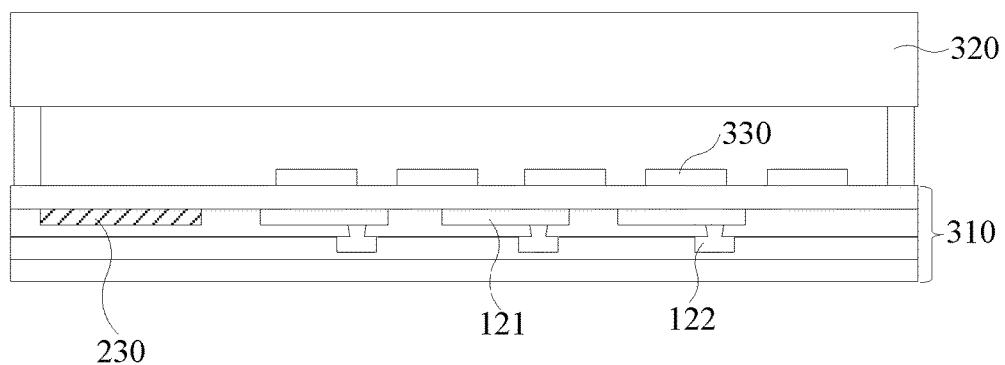
FIG. 21 is a schematic diagram of another cross-sectional structure taken along a dotted line AB in FIG. 1.
Figure 22:
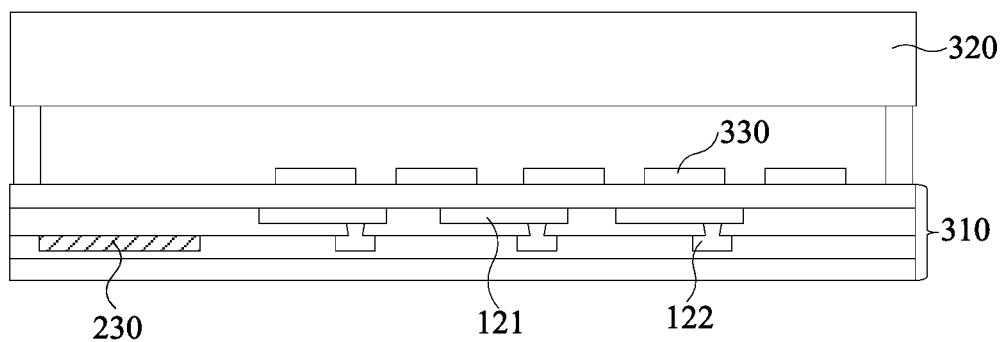
FIG. 22 is a schematic diagram of another cross-sectional structure taken along a dotted line AB in FIG. 1.
Figure 23:
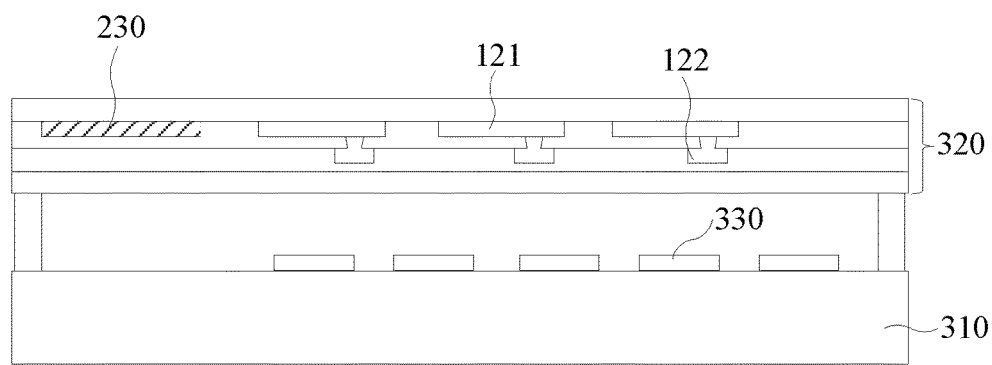
FIG. 23 is a schematic diagram of another cross-sectional structure taken along a dotted line AB in FIG. 1.
Figure 24:
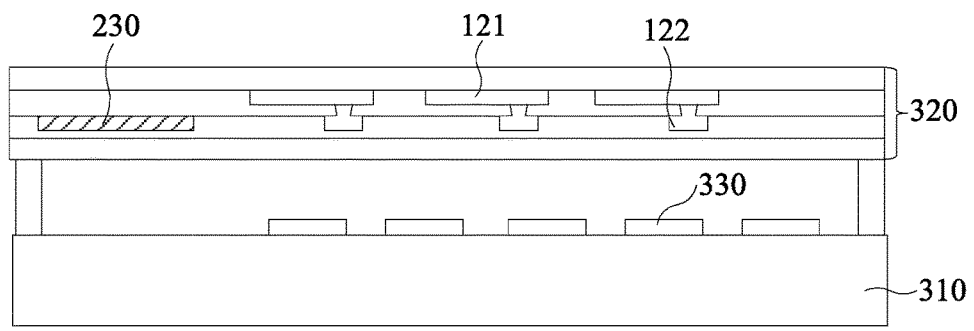
FIG. 24 is a schematic diagram of another cross-sectional structure taken along a dotted line AB in FIG. 1.

Further, in order to simplify the fabricating process of the display panel and facilitate the thinning of the display panel, the first pressure sensor 230 may be disposed in a same layer as certain structures of the display panel. Exemplarily, for a liquid crystal display panel, when the touch function is integrated, the first pressure sensor 230 may be arranged at the same layer as a touch control electrode 121 or a touch wiring 122. Depending on the structure of the display panel, the touch electrode 121 and the touch wiring 122 may be disposed on the color filter substrate 120 (as shown in FIGS. 15 and 16) or on the array substrate 110 (as shown in FIGS. 17 and 18). Optionally, as shown in FIG. 19, the first pressure sensor 230 may also be arranged at a same layer as an active layer 123 of the array substrate 110. Furthermore, for the organic light-emitting display panel, the first pressure sensor 230 may also be arranged at a same layer as the active layer 123 of the array substrate 310 (as shown in FIG. 20). When the touch function is integrated in the organic light-emitting display panel, the first pressure sensor 230 may be arranged at a same layer as the touch electrode 121 or the touch wiring 122, and the touch electrode 121 and the touch wiring 122 may be disposed inside the array substrate 310 (as shown in FIG. 21 and FIG. 22). Alternatively, when the encapsulation layer 320 is a glass cover plate, the touch electrode 121 and the touch wiring 122 may be disposed on the cover plate (as shown in FIG. 23 and FIG. 24).

Figure 25:
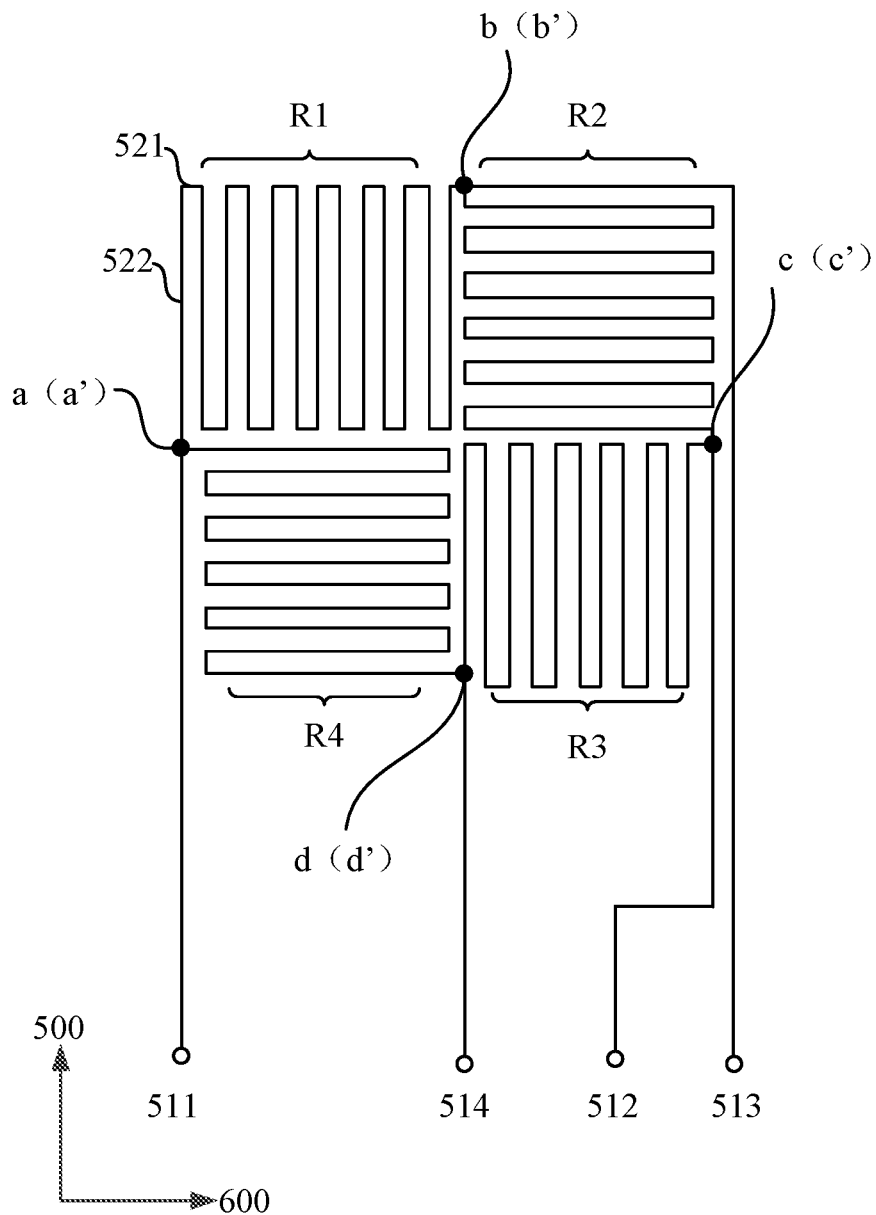
FIG. 25 is a structural schematic diagram of a pressure sensor provided by an embodiment of the present disclosure.

Exemplarily, FIG. 25 is a structural schematic diagram of a pressure sensor provided by an embodiment of the present disclosure. With reference to FIG. 25, the pressure sensor includes a first power signal inputting terminal 511 and a second power signal inputting terminal 512. In addition, the pressure sensor further includes a first sense signal measuring terminal 513 and a second sense signal measuring terminal 514. The pressure sensor includes a first sensing resistor R1, a second sensing resistor R2, a third sensing resistor R3 and a fourth sensing resistor R4. A first end a of the first sensing resistor R1 and a first end a' of the fourth sensing resistor R4 are electrically connected to the first power signal inputting terminal 511. A second end b of the first sensing resistor R1 and a first end b' of the second sensing resistor R2 are electrically connected to the first sensing signal measuring terminal 513. A second end d of the fourth sensing resistor R4 and a first end d' of third sensing resistor R3 are electrically connected to the second sensing signal measuring terminal 514. A second end c of the second sensing resistor R2 and a second end c' of the third sensing resistor R3 are electrically connected to second power signal inputting terminal 512. The first power signal inputting terminal 511 and the second power signal inputting terminal 512 are used to input a power drive signal to the pressure sensor, and the first sensing signal measuring terminal 513 and the second sensing signal measuring terminal 514 are used to output a pressure sensing detection signal from the pressure sensor.

Still referring to FIG. 25, a Wheatstone bridge is formed by the first sensing resistor R1, the second sensing resistor R2, the third sensing resistor R3 and the fourth sensing resistor R4. When a bias voltage signal is applied to the first power signal inputting terminal 511 and the second power signal inputting terminal 512, each branch of the Wheatstone bridge has a current flowing therethrough. At this time, when the display panel is pressed, resistors (including the first sensing resistor, the second sensing resistor, the third sensing resistor and the fourth sensing resistor) of the pressure sensor are changed in resistance, since the pressure sensor is affected by the shearing force from the position corresponding to the pressure sensor in the display panel, so that the difference between the electrical signals outputted from the first sense signal measuring terminal 513 and the second sense signal measuring terminal 514 of the pressure sensor is different from the difference between the electrical signals outputted from the first sense signal measuring terminal 513 and the second sense signal measuring terminal 514 without an applied pressure. Therefore, the magnitude of the touch pressure may be determined.

It should be noted that since the Wheatstone bridge is disposed in the display panel, when a pressure is applied to the display panel, the display panel is deformed, so that the first sensing resistor R1, the second sensing resistor R2, the third sensing resistor R3 and the fourth sensing resistor R4 are all deformed. In order to detect the magnitude of the touch pressure, the deformations of the first sensing resistor R1, the second sensing resistor R2, the third sensing resistor R3 and the fourth sensing resistor R4 should be different from each other.

Optionally, with reference to FIG. 25, a component of an extension length of the first sensing resistor R1 from the first end a to the second end b thereof in a first extension direction 500 is longer than that in a second extension direction 600; a component of an extension length of the second sensing resistor R2 from the first end b' to the second end c thereof in the second extension direction 600 is longer than that in the first extension direction 500; a component of extension length of the third sensing resistor R3 from the first end d' to the second end c' thereof in the first extension direction 500 is longer than that in the second extension direction 600; and the component of extension length of the fourth sensing resistor R4 from the first end a' to the second end d thereof in the second extension direction 600 is longer than that in the first extension direction 500. The first extension direction 500 and the second extension direction 600 are configured to be crossed with each other. When the first pressure sensor 230 shown in FIG. 1 employs the pressure sensor structure in this embodiment, the first extension direction 500 is the same as the first strain detection 100 of the first pressure sensor 230, and the second extension direction 600 is the same as the second strain detection direction 200 of the first pressure sensor 230.

It should be noted that the extension length refers to the deformation length of the sensing resistor in the pressure sensor when the user performs the pressure touch operation.

Such configuration allows the first sensing resistor R1 and the third sensing resistor R3 to sense the strain in the first extension direction 500, and allows the second sensing resistor R2 and the fourth sensing resistor R4 to sense the strain in the second extension direction 600. Since the direction in which the strain is sensed by the first sensing resistor R1 is different from the direction in which the strain is sensed by the second sensing resistor R2, and the direction in which the strain is sensed by the fourth sensing resistor R4 is different from the direction in which the strain is sensed by the third sensing resistor R3, the first sensing resistor R1, the second sensing resistor R2, the third sensing resistor R3 and the fourth sensing resistor R4 may be disposed in the same position or the positions close to each other, so that the first sensing resistor R1, the second sensing resistor R2, the third sensing resistor R3 and the fourth sensing resistor R4 have synchronous temperature change, thereby eliminating the affection caused by the temperature difference and hence improving the pressure-sensing accuracy.

Further, in a plane which is perpendicular to a thickness direction of each sensing resistor, a maximum distance between a point at each edge of the first sensing resistor R1 and a point at each edge of the third sensing resistor R3 is less than 1 mm, and a maximum distance between a point at any edge of the second sensing resistor R2 and a point at any edge of the fourth sensing resistor R4 is less than 1 mm. It should be noted that the maximum distance between a point at each edge of a sensing resistor and a point at each edge of another sensing resistor is the minimum size of a region where the two sensing resistors are located. Such configuration allows two sensing resistors which sense strains in a same direction to be adequately close to each other, thereby more effectively eliminating the effect of temperature difference on the accuracy of pressure sensor detection.

It should be noted that the first sense signal measuring terminal 513 and the second sense signal measuring terminal 514 of the pressure sensor may also be electrically connected to an external circuitry, and just like the first power signal inputting terminal 511 and the second power signal inputting terminal 512, are passages through which the static electricity are transmitted to the pressure sensor. Therefore, in addition to configuring the first power signal inputting terminal 511 and/or the second power signal inputting terminal 512 to be electrically connected to an electrostatic discharge unit, the first sense signal measuring terminal 513 and/or the second sense signal measuring terminal 514 may also be configured to be electrically connected to an electrostatic discharge unit.

Still referring to FIG. 25, each of the first sensing resistor R1, the second sensing resistor R2, the third sensing resistor R3 and the fourth sensing resistor R4 includes a plurality of strip-shaped first sub portions 521 and a plurality of strip-shaped second sub portions 522. The length of the first sub portion 521 is longer than the length of the second sub portion 522. The extension direction of the first sub portion 521 is perpendicular to the extension direction of the second sub portion 522. The first sub portions 521 and the second sub portions 522 are alternately connected. Two ends of each of the plurality of first sub portions 521 are connected to two of the plurality of second sub portions 522, respectively. In the first sensing resistor R1 and the third sensing resistor R3, the extension direction of the first sub portion 521 is the same as the first extension direction 500, the extension direction of the second sub portion 522 is the same as the second extension direction 600. In the second sensing resistor R2 and the fourth sensing resistor R4, the extension direction of the first sub portion 521 is the same as the second extension direction 600, the extension direction of the second sub portion 522 is the same as the first extension direction 500.

Exemplarily, material of the first sensing resistor R1, the second sensing resistor R2, the third sensing resistor R3 and the fourth sensing resistor R4 may be any one of molybdenum, aluminum, titanium, indium tin oxide and polysilicon. In other implementations of this embodiment, an operator may select other suitable material to form the first sensing resistor R1, the second sensing resistor R2, the third sensing resistor R3 and the fourth sensing resistor R4 according to actual requirements.

Figure 26:
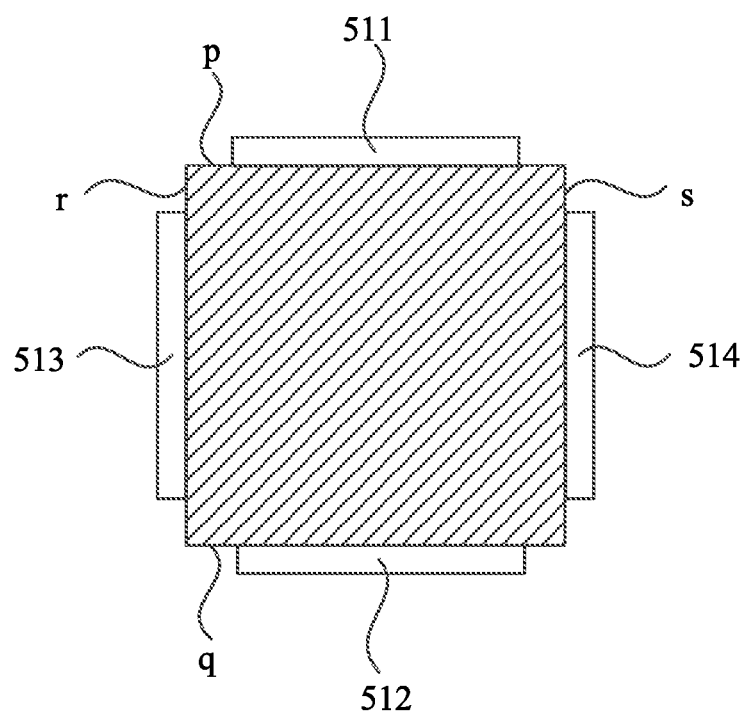
FIG. 26 is a structural schematic diagram of another pressure sensor provided by an embodiment of the present disclosure.

FIG. 26 is a structural schematic diagram of another pressure sensor provided by an embodiment of the present disclosure. As shown in FIG. 26, the pressure sensor includes a first power signal inputting terminal 511 and a second power signal inputting terminal 512. Further, the pressure sensor further includes a first sense signal measuring terminal 513 and a fourth sense signal measuring terminal 514. The pressure sensor is a polygonal at least including four edges. The first power signal inputting terminal 511 is at the first edge p of the polygonal, and the second power signal inputting terminal 512 is at the second edge q of the polygonal. The first power signal inputting terminal 511 and the second power signal inputting terminal 512 are configured to input a power driving signal to the pressure sensor. The first sense signal measuring terminal 513 is at the third edge r of the polygonal, and the second sense signal measuring terminal 514 is at the fourth edge s of the polygonal. The first sense signal measuring terminal 513 and the second sense signal measuring terminal 514 are configured to output a pressure sensing detection signal from the pressure sensor. A first line connecting the first power signal inputting terminal 511 and the second power signal inputting terminal 512 intersects with a second line connecting the first sense signal measuring terminal 513 and the second sense signal measuring terminal 514. When the first pressure sensor 230 shown in FIG. 1 employs the pressure sensor structure of this embodiment, the extension direction of the first edge p and the second edge q is the same as the first strain detection direction 100 of the first pressure sensor, and the extension direction of the third edge r and the fourth edge s is the same as the second strain detection direction 200.

Figure 27:
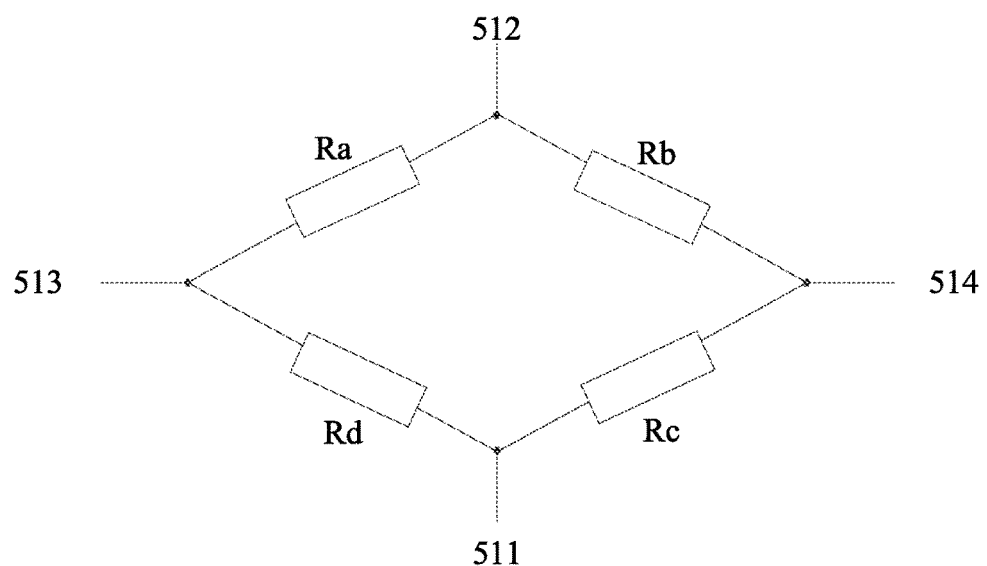
FIG. 27 is an equivalent circuit diagram of the pressure sensor in FIG. 26.

FIG. 27 is an equivalent circuit diagram of the pressure sensor in FIG. 26. With reference to FIGS. 26 and 27, the pressure sensor may be equivalent to a Wheatstone bridge. The Wheatstone bridge includes four equivalent resistors, namely the equivalent resistor Ra, the equivalent resistor Rb, the equivalent resistor Rc and the equivalent resistor Rd, respectively. A region between the second power signal inputting terminal 512 and the first sense signal measuring terminal 513 is the equivalent resistor Ra. A region between the second power signal inputting terminal 512 and the second sense signal measuring terminal 514 is the equivalent resistor Rb. A region between the first power signal inputting terminal 511 and the first sense signal measuring terminal 513 is the equivalent resistor Rd. A region between the first power signal inputting terminal 511 and the second sense signal measuring terminal 514 is the equivalent resistor Rc. When a bias voltage signal is applied to the first power signal inputting terminal 511 and the second power signal inputting terminal 512, each branch of the Wheatstone bridge has a current flow therethrough. At this time, when the display panel is pressed, since the pressure sensor is affected by the shearing force from the position corresponding to the pressure sensor in the display panel, at least one of the equivalent resistor Ra, the equivalent resistor Rb, the equivalent resistor Rc and/or the equivalent resistor Rd changes in impedance, so that the difference between the pressure detection signals outputted from the first sense signal measuring terminal 513 and the second sense signal measuring terminal 514 of the pressure sensor is different from the difference between the pressure detection signals outputted from the first sense signal measuring terminal 513 and the second sense signal measuring terminal 514 without an applied pressure. Therefore, the magnitude of the touch pressure may be determined.

Figure 28:
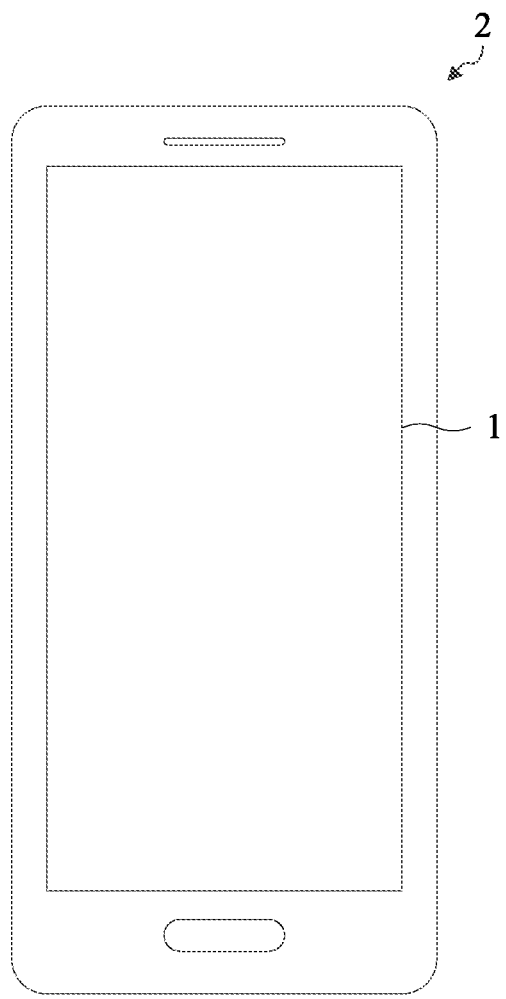
FIG. 28 is a structural diagram of a display device provided by an embodiment of the present disclosure.

FIG. 28 is a structural diagram of a display device provided by an embodiment of the present disclosure. As shown in FIG. 28, the display device 2 includes the display panel 1 in any embodiment of the present disclosure.

It should be noted that the above contents are only preferred embodiments of the present disclosure and its technical principles. It can be understood for those skilled in the art that the present disclosure is not limited to specific embodiments described herein. For those skilled in the art, the present disclosure may be subject to various apparent variations, readjustments and replacements without departing from a protection scope of the present disclosure. Therefore, although the present disclosure is described in detail through above embodiments, the present disclosure is not only limited to above embodiments. The present disclosure can also include more other equivalent embodiments without deviating from conceptions of the present disclosure. A scope of the present disclosure is determined by a scope of attached claims.

What is claimed is:

1. A display panel, comprising:
   a first edge and a third edge arranged to be opposite to each other;
   a second edge and a fourth edge arranged to be opposite to each other;
   at least one notch arranged on one or more of the first edge, the second edge, the third edge and the fourth edge respectively; and
   a display region surrounding by a non-display region,
   wherein both the first edge and the third edge extend in a first direction, both the second edge and the fourth edge extend in a second direction perpendicular to the first direction, and adjacent two of the first edge, the second edge, the third edge and the fourth edge of the display panel are connected by a predefined angle,
   wherein at least one side of the notch comprises a protrusion structure, the non-display region comprises at least one first non-display region arranged along edges of the protrusion structure, and wherein the first non-display region comprises at least one first pressure sensor,
   wherein the first pressure sensor comprises a first strain detection direction and a second strain detection direction, an included angle between the first strain detection direction and the first edge of the display panel is greater than or equal to 65 degrees and less than or equal to 115 degrees, an included angle between the second strain detection direction and the first edge of the display panel is greater than or equal to −25 degrees and less than or equal to 0 degree, wherein the non-display region comprises a control chip, and the first edge is an edge of the display panel close to the control chip.

2. The display panel according to claim 1, wherein the first pressure sensor comprises a first power signal inputting terminal, a second power signal inputting terminal, a first sense signal detecting terminal, a second sense signal detecting terminal, a first sensing resistor, a second sensing resistor, a third sensing resistor and a fourth sensing resistor,
   a first end of the first sensing resistor and a first end of the fourth sensing resistor are both electrically connected to the first power signal inputting terminal; a second end of the first sensing resistor and a first end of the second sensing resistor are both electrically connected to the first sense signal detecting terminal; a second end of the fourth sensing resistor and a first end of the third sensing resistor are both electrically connected to the second sense signal detecting terminal; a second end of the second sensing resistor and a second end of the third sensing resistor are both electrically connected to the second power signal inputting terminal;
   the first power signal inputting terminal and the second power signal inputting terminal are configured to input a bias voltage signal to the first pressure sensor, and the first sense signal detecting terminal and the second sense signal detecting terminal are configured to output a pressure sensing detection signal from the first pressure sensor.

3. The display panel according to claim 2, wherein the first sensing resistor, the second sensing resistor, the third sensing resistor and the fourth sensing resistor are made of one of molybdenum, aluminum, titanium, indium tin oxide and polysilicon.

4. The display panel according to claim 2, wherein a component of an extension length of the first sensing resistor from the first end to the second end thereof in a first extension direction is longer than that in a second extension direction; a component of an extension length of the second sensing resistor from the first end to the second end thereof in the second extension direction is longer than that in the first extension direction; a component of an extension length of the third sensing resistor from the first end to the second end thereof in the first extension direction is longer than that in the second extension direction; a component of an extension length of the fourth sensing resistor from the first end to the second end thereof in the second extension direction is longer than that in the first extension direction, and the first extension direction and the second extension direction are crossed with each other; and the first extension direction is the same as the first strain detection direction and the second extension direction is the same as the second strain detection direction.

5. The display panel according to claim 4, wherein
the first sensing resistor, the second sensing resistor, the third sensing resistor and the fourth sensing resistor each comprise a plurality of strip-shaped first sub portions and a plurality of strip-shaped second sub portions, a length of the plurality of first sub portions is longer than a length of the plurality of second sub portions, an extension direction of the plurality of first sub portions is perpendicular to an extension direction of the plurality of second sub portions, the plurality of first sub portions and are alternately connected with the plurality of second sub portions, and the two ends of each of the plurality of first sub portions are connected to two second sub portions of the plurality of second sub portions, respectively; and in the first sensing resistor and the third sensing resistor, the extension direction of the plurality of first sub portions is the same as the first extension direction, the extension direction of the plurality of second sub portions is the same as the second extension direction; and in the second sensing resistor and the fourth sensing resistor, the extension direction of the plurality of first sub portions is the same as the second extension direction, the extension direction of the plurality of second sub portions is the same as the first extension direction.

6. The display panel according to claim 4, wherein
in a plane perpendicular to a thickness direction of each of the first sensing resistor, the second sensing resistor, the third sensing resistor and the fourth sensing resistor, a maximum distance between a point at each edge of the first sensing resistor and a point at each edge of the third sensing resistor is less than 1 mm, and a maximum distance between a point at each edge of the second sensing resistor and a point at each edge of the fourth sensing resistor is less than 1 mm.

7. The display panel according to claim 1, wherein
the first pressure sensor is a quadrangle comprising a first edge and a second edge arranged to be opposite to each other, a third edge and a fourth edge arranged to be opposite to each other;

the first pressure sensor comprises a first power signal inputting terminal at the first edge thereof and a second power signal inputting terminal at the second edge thereof, in order to input a bias voltage signal to the one first pressure sensor;

the first pressure sensor further comprises a first sense signal detecting terminal at the third edge thereof and a second sense signal detecting terminal at the fourth edge thereof, in order to output a pressure sensing detection signal from the first pressure sensor; and an extension direction of the first edge and the second edge of the first pressure sensor is the same as the first strain detection direction, and an extension direction of the third edge and the fourth edge of the first pressure sensor is the same as the second strain detection direction.

8. The display panel according to claim 1, wherein
an included angle between the first edge of the display panel and the first strain detection direction is about 90 degrees, and an included angle between the first edge of the display panel and the second strain detection is about 0 degree.

9. The display panel according to claim 1, wherein
a shape of the one notch is rectangular, semicircular, triangular or trapezoidal.

10. The display panel according to claim 1, wherein
the non-display region further comprises a second non-display region other than the at least one first non-display region, wherein the second non-display region comprises at least one second pressure sensor, the second pressure sensor comprises a third strain detection direction and a fourth strain detection direction, an included angle between the third strain detection direction and the first edge of display panel is greater than or equal to 20 degrees and less than or equal to 70 degrees, and an included angle between the fourth strain detection direction and the first edge of the display panel is greater than or equal to −70 degrees and less than or equal to −20 degrees.

11. The display panel according to claim 10, wherein
the included angle between the third strain detection direction and the first edge of display panel is about 45 degrees, and the included angle between the fourth strain detection direction and the first edge of the display panel is about −45 degrees.

12. The display panel according to claim 1, wherein
the display panel comprises an array substrate, a color filter substrate arranged to be opposite to the array substrate and a liquid crystal layer between the array substrate and the color filter substrate.

13. The display panel according to claim 12, wherein
the first pressure sensor is disposed on a surface of the color filter substrate away from the array substrate.

14. The display panel according to claim 12, wherein
the first pressure sensor is disposed inside the color filter substrate.

15. The display panel according to claim 12, wherein
the first pressure sensor is disposed on a surface of the color filter substrate facing the array substrate.

16. The display panel according to claim 12, wherein
the first pressure sensor is disposed on a surface of the array substrate away from the color filter substrate.

17. The display panel according to claim 12, wherein
the first pressure sensor is disposed on a surface of the array substrate facing the color filter substrate.

18. The display panel according to claim 12, wherein
the first pressure sensor is disposed inside the array substrate.

19. The display panel according to claim 1, wherein
the display panel comprises an array substrate, an organic light-emitting device layer and an encapsulation layer.

20. The display panel according to claim 19, wherein
the first pressure sensor is disposed inside the array substrate.

21. The display panel according to claim 19, wherein
the first pressure sensor is disposed on a surface of the encapsulation layer facing the array substrate.

22. The display panel according to claim 19, wherein
the first pressure sensor is disposed on a surface of the encapsulation layer away from the array substrate.

23. The display panel according to claim 19, wherein
the first pressure sensor is disposed inside the encapsulation layer.

24. A display device, comprising a display panel, wherein the display panel comprises:

a first edge and a third edge arranged to be opposite to each other;
a second edge and a fourth edge arranged to be opposite to each other;
at least one notch arranged on one or more of the first edge, the second edge, the third edge and the fourth edge respectively; and
a display region surrounding by a non-display region,
wherein both the first edge and the third edge extend in a first direction, both the second edge and the fourth edge extend in a second direction perpendicular to the first direction, and adjacent two of the first edge, the second edge, the third edge and the fourth edge of the display panel are connected by a predefined angle,
wherein at least one side of the notch comprises a protrusion structure, the non-display region comprises at least one first non-display region arranged along edges of the protrusion structure, and wherein the first non-display region comprises at least one first pressure sensor,
wherein the first pressure sensor comprises a first strain detection direction and a second strain detection direction, an included angle between the first strain detection direction and the first edge of the display panel is greater than or equal to 65 degrees and less than or equal to 115 degrees, an included angle between the second strain detection direction and the first edge of the display panel is greater than or equal to −25 degrees and less than or equal to 0 degree, wherein the non-display region comprises a control chip, and the first edge is an edge of the display panel close to the control chip.

* * * * *